(12) United States Patent
Yamamoto

(10) Patent No.: US 7,224,053 B2
(45) Date of Patent: May 29, 2007

(54) SEMICONDUCTOR DEVICE RESPONSIVE TO DIFFERENT LEVELS OF INPUT AND OUTPUT SIGNALS AND SIGNAL PROCESSING SYSTEM USING THE SAME

(75) Inventor: Hitoshi Yamamoto, Hyogo-ken (JP)

(73) Assignee: Ricoh Company, Ltd., Tokyo (JP)

(*) Notice: Subject to any disclaimer, the term of this patent is extended or adjusted under 35 U.S.C. 154(b) by 20 days.

(21) Appl. No.: 10/656,434

(22) Filed: Sep. 5, 2003

(65) Prior Publication Data
US 2004/0130016 A1 Jul. 8, 2004

(30) Foreign Application Priority Data
Sep. 6, 2002 (JP) .............................. 2002-261311

(51) Int. Cl.
H01L 23/02 (2006.01)
H01L 23/48 (2006.01)
H01L 23/50 (2006.01)
H01L 26/065 (2006.01)

(52) U.S. Cl. .............................. 257/679; 257/E23.034; 257/E23.052; 257/E23.124; 257/685; 257/666; 257/728; 257/724; 257/725; 257/691; 257/698; 257/696; 257/784; 257/786; 257/676; 257/E25.012; 257/E23.079; 257/723; 257/690; 257/692

(58) Field of Classification Search ................ 257/685, 257/686, 723, 666, 777, 728, 787, 784, 696, 257/698, 691, 690, 211, 210, 208, 203, 676, 257/687; 365/205, 194, 201, 233

See application file for complete search history.

(56) References Cited

U.S. PATENT DOCUMENTS

| | | | | |
|---|---|---|---|---|
| 5,187,484 A | * | 2/1993 | Stove | .......................... 342/200 |
| 5,245,215 A | * | 9/1993 | Sawaya | ....................... 257/676 |
| 5,543,640 A | * | 8/1996 | Sutherland et al. | ......... 257/202 |
| 5,552,966 A | * | 9/1996 | Nagano | ....................... 361/813 |
| 5,723,906 A | * | 3/1998 | Rush | ........................... 257/723 |
| 6,014,586 A | * | 1/2000 | Weinberg et al. | ............. 607/36 |
| 6,198,392 B1 | * | 3/2001 | Hahn et al. | .............. 340/572.4 |
| 6,333,549 B2 | * | 12/2001 | Drehobl et al. | ............. 257/666 |
| 6,560,164 B2 | * | 5/2003 | Kawai et al. | ................ 365/233 |
| 6,615,027 B1 | * | 9/2003 | Sahota et al. | .................. 455/91 |

(Continued)

FOREIGN PATENT DOCUMENTS

EP 0363626 * 4/1990

(Continued)

*Primary Examiner*—Alexander Oscar Williams
(74) *Attorney, Agent, or Firm*—Cooper & Dunham LLP

(57) ABSTRACT

A semiconductor device which integrates a plurality of semiconductor chips into a single package includes a first semiconductor chip and a second semiconductor chip. The first semiconductor chip includes a plurality of first bonding pads outputting first signals having a first level. The second semiconductor chip includes a plurality of second bonding pads and a plurality of third bonding pads. The plurality of second bonding pads is electrically coupled to a part of the plurality of first bonding pads to receive the first signals having the first level from the first semiconductor chip through the part of the plurality of first bonding pads. The plurality of third bonding pads converts the first signals received through the plurality of second bonding pad into second signals having a second level different from the first level and outputs the second signals through the plurality of third bonding pads.

10 Claims, 4 Drawing Sheets

U.S. PATENT DOCUMENTS

| | | |
|---|---|---|
| 6,674,304 B1 * | 1/2004 | Matthews .................... 326/80 |
| 6,717,179 B1 * | 4/2004 | Yamazaki et al. ............ 257/59 |
| 6,831,561 B2 * | 12/2004 | Hahn et al. ............... 340/572.4 |
| 6,853,063 B2 * | 2/2005 | Akiyama et al. ........... 257/685 |
| 2003/0001808 A1 * | 1/2003 | Sakuma et al. ............... 345/87 |
| 2004/0119150 A1 * | 6/2004 | Hwang et al. .............. 257/686 |

FOREIGN PATENT DOCUMENTS

| | | | |
|---|---|---|---|
| JP | 63-104529 | * | 5/1988 |
| JP | 7-153564 | * | 6/1995 |
| WO | WO 01/54047 A1 | | 7/2001 |

* cited by examiner

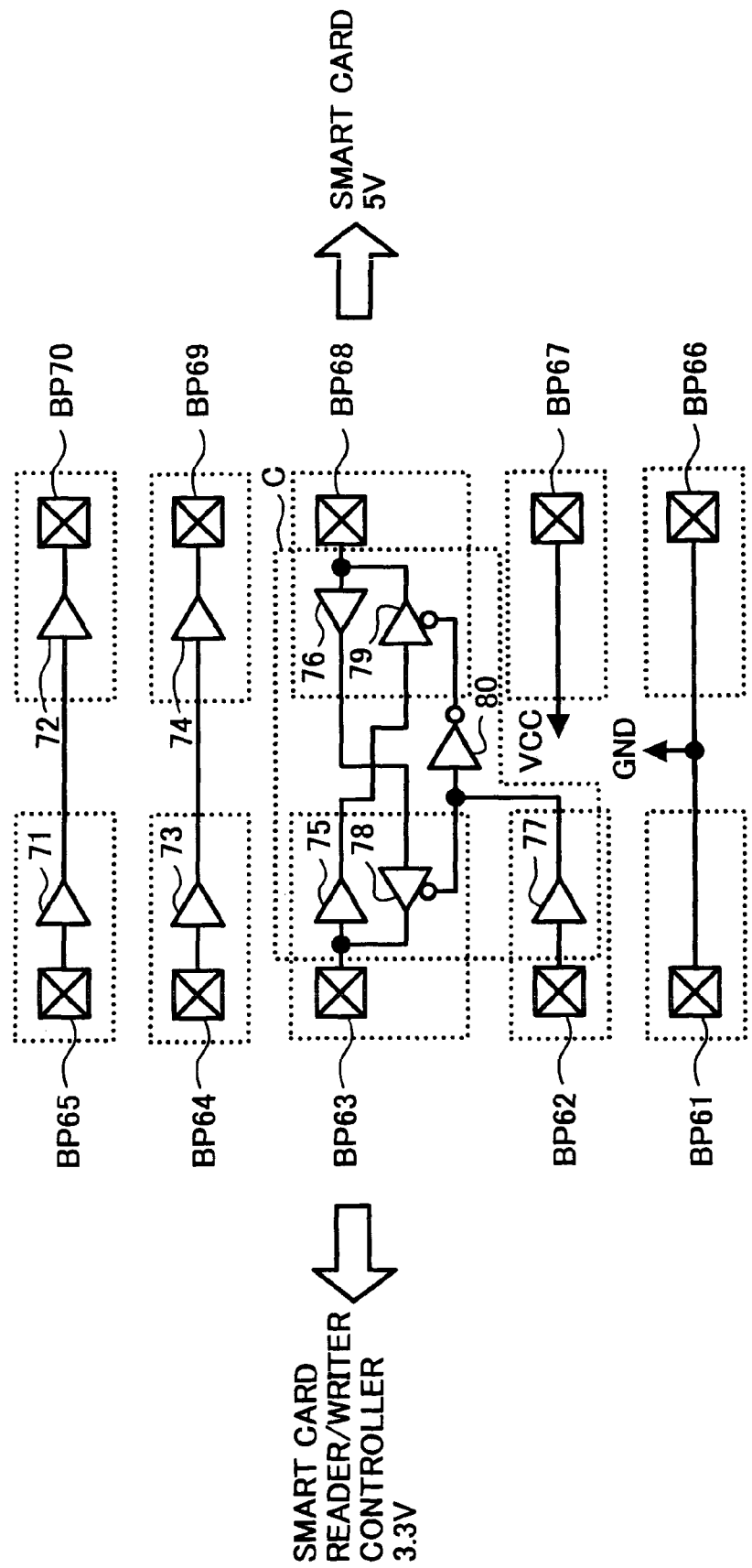

SEMICONDUCTOR DEVICE RESPONSIVE TO DIFFERENT LEVELS OF INPUT AND OUTPUT SIGNALS AND SIGNAL PROCESSING SYSTEM USING THE SAME

FIELD

This patent specification describes a semiconductor device responsive to different levels of input and output signals and a signal processing system for processing signals of different levels using the semiconductor device.

BACKGROUND

Input and output signal levels of chips included in semiconductor devices generally decrease as chip design rules decrease. For example, when chips are manufactured in a 0.5 μm process or more, input and output signal levels are often 5 volts or more. On the other hand, when chips are manufactured in a 0.35 μm process or less, input and output signal levels are set to 3.3 volts or less. Some chips manufactured in the 0.35 μm process can be operated in response to not only 3.3 volt level signals, but also 5 volt level signals using well known tolerant techniques.

Hereinafter, as one example of systems for processing different levels of signals, a system including a smart card and a smart card reader/writer apparatus will be considered. In operation, the smart card reader/writer apparatus sends a clock signal CLK and a reset signal RST to the smart card and also exchanges a data signal D with the smart card.

Semiconductor chips integrated in a main body of the smart card are limited to a specification due to global standards for electronic cards so that the chips have lagged in miniaturization, in particular, in reducing supply voltage. By contrast, semiconductor device chips used by the smart card reader/writer apparatus continue to increase miniaturization in a semiconductor production process, that is, consume less power supply voltage due to no specification limitation. Specifically, the semiconductor chips integrated in the main body of the smart card are manufactured in 0.5 μm processes to be driven at 5 volts. On the other hand, the semiconductor chips used by the smart card reader/writer apparatus are manufactured in below 0.35 μm (e.g., 0.25 μm) processes to be driven at 3.3 volts.

It is possible to drive the semiconductor device chips of the above-mentioned reader/writer apparatus operating with 3.3 volt level signals using 5 volt level input signals by applying a known tolerant technique. However, an increase in the chip output signal levels from 3.3 volts to 5 volts makes the chip more complex, larger in size, and higher in cost. Moreover, low voltage (3.3 volts) driven less power-consuming chips are manufactured in 0.35 μm processes to operate at 5 volts. This results in inefficient performance.

The above-mentioned problem is manifested when a substrate of the reader/writer apparatus operates at 3.3 volt signal levels and a portion of pins in the semiconductor device corresponds to a 5-volt drive system, such as the smart card which inputs and outputs 5 volt level signals, as described above.

SUMMARY

In one embodiment, a novel semiconductor device which integrates a plurality of semiconductor chips into a single package includes a first semiconductor chip and a second semiconductor chip. The first semiconductor chip includes a plurality of first bonding pads outputting first signals having a first level. The second semiconductor chip includes a plurality of second bonding pads and a plurality of third bonding pads. The plurality of second bonding pads is electrically coupled to a part of the plurality of first bonding pads to receive the first signals having the first level from the first semiconductor chip through the part of the plurality of first bonding pads. The plurality of third bonding pads converts the first signals received through the plurality of second bonding pad into second signals having a second level different from the first level and outputs the second signals through the plurality of third bonding pads.

The second level may be greater than the first level.

In one embodiment, a novel signal processing system includes a first apparatus and an exchangeable second apparatus. The first apparatus includes a semiconductor device which integrates a plurality of semiconductor chips into a single package and which includes a first semiconductor chip and a second semiconductor chip. The first semiconductor chip includes a plurality of first bonding pads outputting first signals having a first level. The second semiconductor chip includes a plurality of second bonding pads and a plurality of third bonding pads. The plurality of second bonding pads is electrically coupled to a part of the plurality of first bonding pads to receive the first signals having the first level from the first semiconductor chip through the part of the plurality of first bonding pads. The plurality of third bonding pads converts the first signals received through the plurality of second bonding pad into second signals having a second level different from the first level and outputs the second signals through the plurality of third bonding pads. The exchangeable second apparatus is configured to be connected to the first apparatus and to receive the second signals having the second level outputted from the first apparatus through the plurality of third bonding pads.

The second level may be greater than the first level.

In one embodiment, a novel method of manufacturing a semiconductor device for processing different level signals includes the steps of providing and providing. The providing step provides on a substrate a first semiconductor chip which includes a plurality of first bonding pads outputting first signals having a first level. The providing step provides on the substrate a second semiconductor chip and a plurality of third bonding pads. The second semiconductor chip includes a plurality of second bonding pads electrically coupled to a part of the plurality of first bonding pads to receive the first signals having the first level from the first semiconductor chip through the part of the plurality of first bonding pads. The plurality of third bonding pads convert the first signals received through the plurality of second bonding pad into second signals having a second level different from the first level and output the second signals through the plurality of third bonding pads.

The second level may be greater than the first level.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 3 is a diagram illustrating an internal structure of a semiconductor chip for converting a signal level.

DETAILED DESCRIPTION OF PREFERRED EMBODIMENTS

Figure 1:
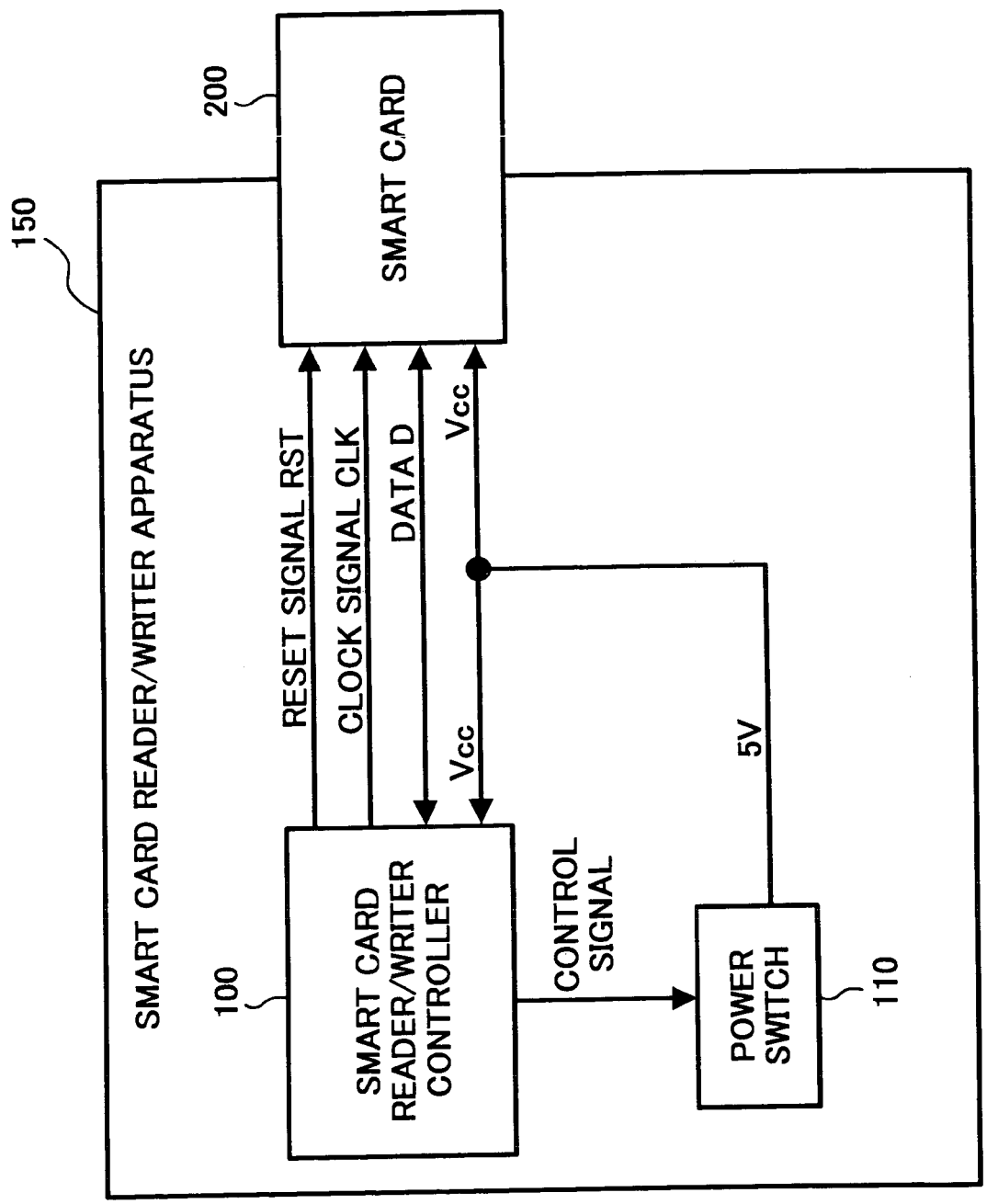
FIG. 1 is a diagram illustrating an exchange of signals between a smart card and a smart card reader/writer apparatus.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, particularly to FIG. 1, a smart card reader/writer apparatus 150 according to a preferred embodiment of the present specification is explained.

As one example of systems for processing different levels of signals, a system is described that has the smart card and the smart card reader/writer apparatus and includes a semiconductor device according to one embodiment.

FIG. 1 is a diagram illustrating a connection of the smart card 200 to the smart card reader/writer apparatus 150. Upon writing data to the smart card 200 or reading data from the smart card 200, a reader/writer controller 100 which is a semiconductor device according to the embodiment sends an ON control signal to a power switch 110. The reader/writer controller 100 then supplies 5 volts to the smart card 200 and an IC2 (see FIG. 2) integrated in the reader/writer controller 100 as will be explained. Subsequently, the reader/writer controller 100 sends a clock signal CLK to the smart card 200 and exchanges the data signal D with the smart card 200. Further, the reader/writer, controller 100 sends a reset signal RST to the smart card 200 as desired. Although not specifically illustrated, it is understood that a ground terminal of the smart card 200 is connected to a ground terminal of the reader/writer apparatus 150.

Figure 2:
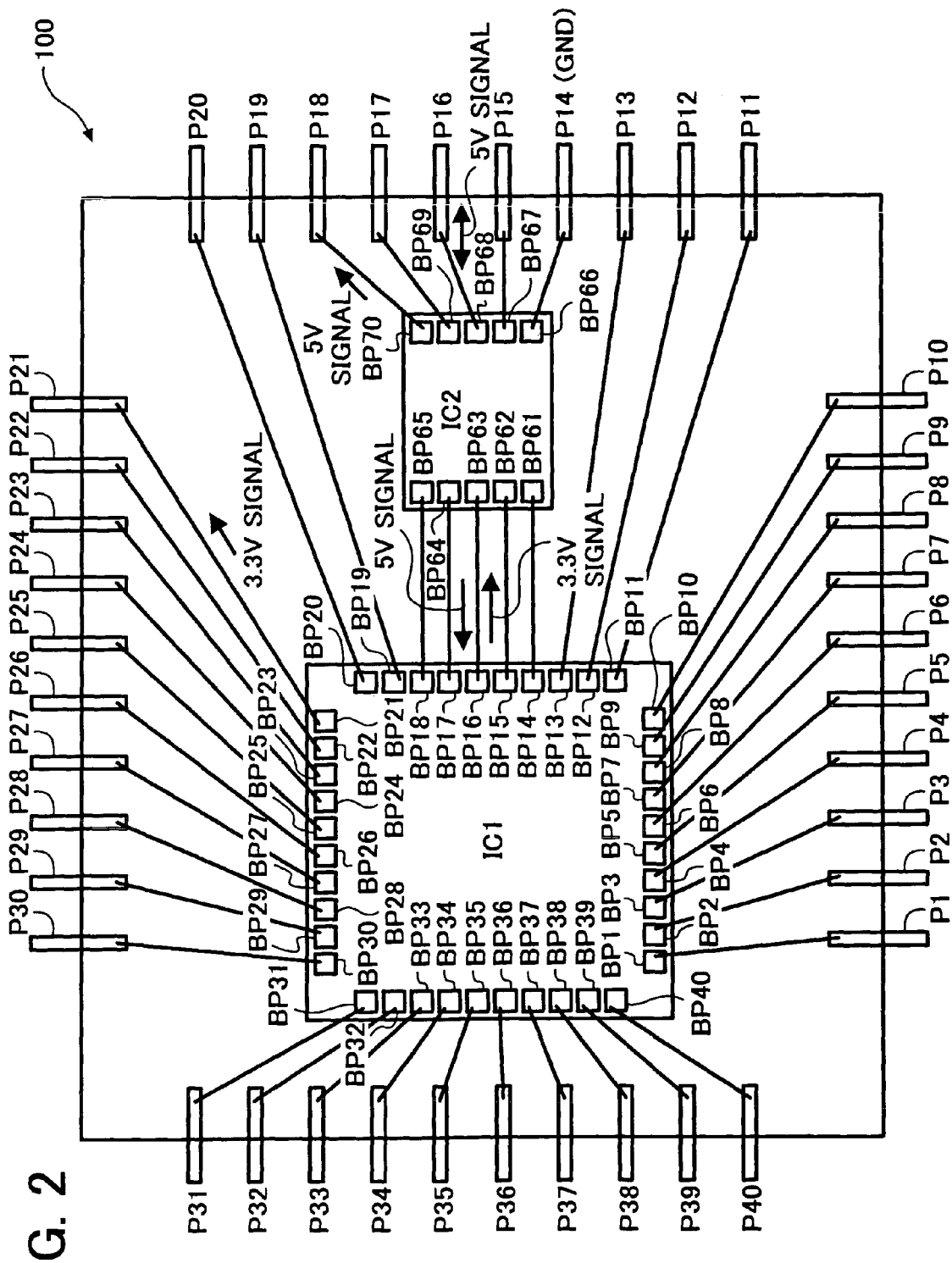
FIG. 2 is a diagram illustrating a structure of a reader/writer controller included in the reader/writer apparatus.

FIG. 2 is a diagram illustrating an internal structure of the reader/writer controller 100 included in the reader/writer apparatus 150. The reader/writer controller 100 is a QFP (Quadrate Flat Package) with 40 lead pins and includes two semiconductor device chips, IC1 and IC2.

The semiconductor chip IC1 is a 3.3-volt driven smart card reader/writer chip and is fabricated in a 0.25 μm process. The semiconductor chip IC1 uses 3.3 volt levels of input and output signals as a first level signal. The semiconductor chip IC1 has 40 bonding pads, BP1 to BP40, and the substrate of the reader/writer controller 100 has lead pins, P1 to P40, arranged around the reader/writer controller 100. The bonding pads BP1 to BP13 are wire-bonded to the lead pins P1 to P13, respectively, and the bonding pads BP19 to BP40 are wire-bonded to lead pins P19 to P40, respectively. Remaining bonding pads, BP14 to BP18, which exchange signals with the smart card 200, are wire-bonded to bonding pads, BP61 to BP65, respectively, which correspond to the semiconductor chip IC2 as will be explained below.

An internal circuit connected to the bonding pad BP16 of the semiconductor chip IC1 bonding pads BP14 to BP18 is set to 5 volts tolerant since bonding pad BP16 at least receives 5 volt levels of signals from BP63 of the semiconductor chip IC2. This enables the semiconductor chip IC1 to operate normally in response to 5 volt levels of input signals from the smart card 200.

The semiconductor chip IC2 is a 5-volt driven chip fabricated in a 0.5 μm process and includes bonding pads BP61 to BP70. The semiconductor chip IC2 bonding pads, BP66 to BP70, are wire-bonded to the lead pins, P14 to P18, respectively, which are located at a periphery of the reader/writer controller 100. The detailed structure of the semiconductor chip IC2 will be described later. The semiconductor chip IC2 converts the first level (i.e., 3.3 volt levels) signals outputted from the semiconductor chip IC1 into a second level (i.e., 5 volt levels) signals, and then outputs the signal to the smart card 200. The semiconductor chip IC2 outputs 5 volt level signals sent from the smart card 200 to the semiconductor chip IC1 as 5 volt level signals.

Figure 4A:
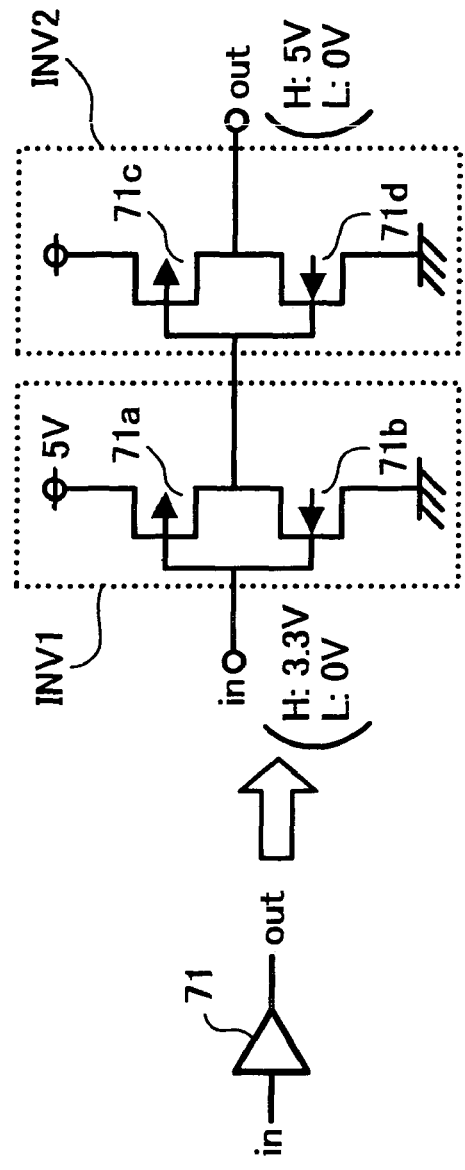
FIGS. 4A and 4B are detailed block diagrams illustrating a buffer circuit and a tri-state circuit which are internal components of the semiconductor chip shown in FIG. 3.
Figure 4B:
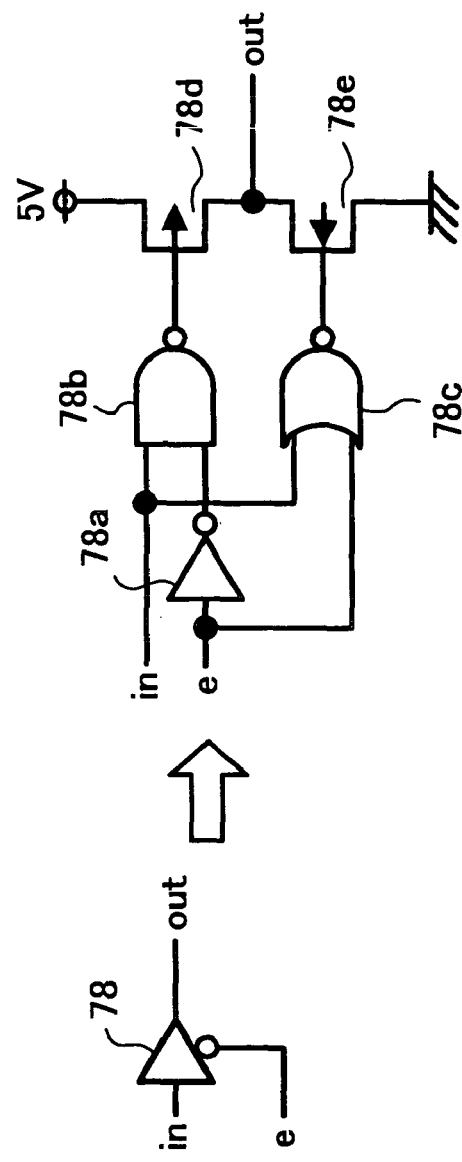

FIG. 3 is a diagram illustrating a structure of the semiconductor chip IC2. As will be explained in greater detail hereinafter, FIGS. 4A and 4B are detailed block diagrams illustrating a buffer circuit 71 and a tri-state circuit 78 which is included in the semiconductor chip IC2 shown in FIG. 3.

The bonding pads, BP61 and BP66, are connected to the ground terminal GND of the semiconductor chip IC2. The bonding pad BP67 is connected to a wire which supplies a power source voltage Vcc of 5 volts to the circuits inside semiconductor chip IC2.

Three bonding pads, BP62, BP63 and BP68 are operatively connected to each other through an I/O interface circuit C of the data signal D. The bonding pad BP62 is connected to an enable terminal of the tri-state circuit 78 through a buffer circuit 77 and an enable terminal of a tri-state circuit 79 through the buffer circuit 77 and an inverter 80. The bonding pad BP63 is connected to a signal output terminal of the tri-state circuit 78 and a signal input terminal of a buffer circuit 75. The bonding pad BP68 is connected to an output terminal of the tri-state circuit 79 and a signal input terminal of a buffer circuit 76.

In the above-mentioned I/O interface circuit C, when the bonding pad BP62 has received a low level control signal, a flow of the data signal D is ensured from the bonding pad BP68 to the bonding pad BP63. This allows reading of data from the smart card 200 to the semiconductor chip IC1. In this case, the bonding pad BP63 of the 3.3-volt driven semiconductor chip IC1 receives 5 volt level signals. However, as mentioned above, the internal circuit connected to the bonding pad BP16 is set to 5 volts tolerant. Thus, no problem arises in the circuit.

Meanwhile, when the bonding pad BP62 has received a high level control signal, the flow of the data signal D is ensured from the bonding pad BP63 to the bonding pad BP68. This allows reading of data from the reader/writer controller 150 to the smart card 200. In this case, the 3.3 volt driven semiconductor chip IC1 outputs 3.3 level signals, which are converted into 5 volt level signals through the 5 volt driven buffer circuit 75. This example is described in greater detail below by the example of the buffer circuit 71. As a result, the 5 volt signals are outputted to the smart card 200. This ensures operating the smart card 200 appropriately.

Two buffer circuits 73 and 74 are provided between bonding pads BP64 and BP69 in the direction shown. Likewise, two buffer circuits 71 and 72 are provided between the bonding pads BP65 and BP70 in the direction shown. The bonding pad BP64 receives 3.3 volt level clock signals CLK from the semiconductor chip IC1. Likewise, the bonding pad BP65 receives 3.3 volt level reset signals RST from the semiconductor chip IC1. As will be explained in greater detail hereinafter by the example of the buffer circuit 71, the 3.3 voltage level clock signals CLK and reset signals RST are converted into 5 volt level signals when passing 5 volt driven buffer circuits 71 and 73, respectively. This ensures operating the smart card 200 appropriately.

FIG. 4A is a detailed block diagram illustrating the buffer circuit 71 shown in FIG. 3. Other buffer circuits 72, 73, 74, 75, 76, and 77 have the same structure as the buffer circuit 71. The buffer circuit 71 connects two inverter circuits INV1 and INV2 in series which have the same structure driven by a 5-volt power supply Vcc. The inverter circuit INV1 includes a P-channel MOS transistor 71a and an N-channel MOS transistor 71b. The P-channel MOS transistor 71a has a gate threshold value $V_{TH}$ of approximately 0 to 1 volts. The N-channel MOS transistor 71b has a gate threshold value $V_{TH}$ of approximately 3.3 volts or less, e.g., 2.5 volts. Likewise, the inverter circuit INV2 includes a P-channel MOS transistor 71c and an N-channel MOS transistor 71d. The P-channel MOS transistor 71c has a gate threshold value $V_{TH}$ of approximately 0 to 1 volts. The N-channel MOS transistor 71d has a gate threshold value $V_{TH}$ of approximately 3.3 volts or less, e.g., 2.5 volts. Such arrangements provide a high level output signal of 5 volt levels when the high level input signal is 3.3 volts.

FIG. 4B is a detailed block diagram illustrating the tri-state circuit 78 shown in FIG. 3. Another tri-state circuit 79 also has the same structure as the tri-state circuit 78. The tri-state circuit 78 operates as a CMOS inverter in response to an input of a low level enable signal e. When the enable signal e has been switched to the high level, the tri-state circuit 78 switches two transistors included in the CMOS inverter OFF to stop their operations.

The detailed structure of the tri-state circuit 78 will be explained. A NAND gate 78b has two signal input terminals. One terminal receives a signal "in" inputted in the tri-state circuit 78. The other terminal receives the enable signal e inverted by an inverter 78a. An output of the NAND gate 78b is outputted to a gate of the P-channel MOS transistor 78d having the gate threshold value voltage $V_{TH}$ of approximately 1 volt. An output of a NOR gate 78c is outputted to a gate of an N-channel MOS transistor 78e having the gate threshold value voltage $V_{TH}$ of approximately 2.5 volts. As shown, the P-channel MOS transistor 78d and the N-channel MOS transistor 78e form the CMOS inverter. In the abovementioned structure, when the low level enable signal e is inputted, the input signal is inverted by the NAND gate 78b and the NOR gate 78e. Subsequently, the input signal is again inverted by the CMOS inverter constructed of two transistors 78d and 78e and is then outputted after having been returned to the original condition. When the high level enable signal e is inputted, the NAND gate 78b outputs the high level signal to turn the P-channel MOS transistor 78d OFF, regardless of input signal levels. On the other hand, the NOR gate 78c outputs the low level signal to turn the N-channel MOS transistor 78e OFF, regardless of input signal levels.

As described above, the reader/writer controller 100 outputs signals from the 3.3-volt driven, less power-consuming semiconductor chip IC1 which is manufactured in a 0.35 µm process. Among the outputted signals, the reader/writer controller 100 converts the only signals outputted to the 5 volt driven smart card 200 manufactured in a 0.5 µm process into 5 volt level signals using the semiconductor chip IC2, and outputs the signals. Such arrangements eliminate the requirement for an additional signal level converter, thereby reducing the size, cost and complexity of the reader/writer apparatus 150 and the system including the apparatus 150 and the smart card 200.

Numerous additional modifications and variations are possible in light of the above teachings. It is therefore to be understood that within the scope of the appended claims, the disclosure of this patent specification may be practiced otherwise than as specifically described herein.

This patent specification is based on and claims priority to Japanese patent application, No. 2002-261311 filed on Sep. 6, 2002 in the Japanese Patent Office, the entire contents of which are incorporated by reference herein.

What is claimed as new and desired to be protected by Letters Patent of the United States is:

1. A semiconductor device which integrates a plurality of semiconductor chips into a single package, comprising:
a first semiconductor chip which includes a plurality of first bonding pads outputting first signals having a first level; and
a second semiconductor chip which includes
a plurality of second bonding pads electrically coupled to a part of the plurality of first bonding pads to receive the first signals having the first level from the first semiconductor chip through the part of the plurality of first bonding pads,
a plurality of third bonding pads, and
a signal level conversion circuit configured to convert the first signals of the first level into second signals having a second level different from the first level and outputs the second signals through the plurality of third bonding pads, and
wherein said first level and said second level correspond to respective, different driving voltages in a digital circuit, and
wherein the second semiconductor chip includes one or more digital circuits configured to receive and operate with signals of the first level as well as signals of a second level corresponding to a second driving voltage.

2. The semiconductor device as defined in claim 1, wherein the second level is greater than the first level.

3. A semiconductor device which integrates a plurality of semiconductor chips into a single package, comprising:
a first semiconductor chip which outputs one or more first signals having a first level; and
a second semiconductor chip which includes a signal level conversion circuit,
wherein said signal level conversion circuit converts the first signals of the first level from the first semiconductor chip into second signals having a second level different from the first level,
wherein said first level and said second level correspond to respective, different first and second driving voltages in a digital circuit, and
wherein the second semiconductor chip includes one or more digital circuits configured to receive and operate with signals of the first level as well as signals of a second level corresponding to a second driving voltage.

4. The semiconductor device as defined in claim 3, wherein said signal level conversion circuit includes a buffer driven at the second level.

5. The semiconductor device as defined in claim 4, wherein said buffer converts an input signal at the first level into an output signal at the second level.

6. The semiconductor device as defined in claim 3, wherein said signal level conversion circuit includes an I/O interface circuit adapted for bi-directional data flow.

7. The semiconductor device as defined in claim 6, wherein said I/O interface circuit includes one or more tri-state circuits.

8. The semiconductor device as defined in claim 3, wherein the second level is greater than the first level.

9. A digital system including the semiconductor device as defined in claim 3, and a second semiconductor device, wherein said second semiconductor device is driven by a driving voltage corresponding to said second level, and said second signals from said semiconductor device as defined in claim 3 are input by said second semiconductor device.

10. A semiconductor device which integrates a plurality of semiconductor chips into a single package, comprising:
   a first semiconductor chip which includes a plurality of first bonding pads outputting first signals having a first level; and
   a second semiconductor chip which includes
      a plurality of second bonding pads electrically coupled to a part of the plurality of first bonding pads to receive the first signals having the first level from the first semiconductor chip through the part of the plurality of first bonding pads,
      a plurality of third bonding pads, and
      a signal level conversions circuit configured to convert the first signals of the first level into second signals having a second level different from the first level and outputs the second signals through the plurality of third bonding pads, and
   wherein said first level and said second level correspond to respective, different driving voltages in a digital circuit, and
   wherein said second semiconductor chip includes one or more digital circuits which are tolerant both to digital input signals of the first level and to digital input signals of the second signal level.

* * * * *